United States Patent [19]

McMinn et al.

[11] Patent Number: 5,721,695
[45] Date of Patent: Feb. 24, 1998

[54] SIMULATION BY EMULATING LEVEL SENSITIVE LATCHES WITH EDGE TRIGGER LATCHES

[75] Inventors: Brian D. McMinn, Buda; Gopi Ganapathy, Austin, both of Tex.

[73] Assignee: Advanced Micro Devices, Inc., Sunnyvale, Calif.

[21] Appl. No.: 323,644

[22] Filed: Oct. 17, 1994

[51] Int. Cl.$^6$ ........................................ G06F 11/22
[52] U.S. Cl. .................... 364/578; 364/488; 395/500
[58] Field of Search .................... 364/578, 488, 364/491, 232.8; 395/500, 183; 375/373; 327/175; 371/23, 22.1

[56] References Cited

U.S. PATENT DOCUMENTS

| | | | |
|---|---|---|---|
| 4,435,763 | 3/1984 | Bellay et al. | 364/200 |
| 4,697,241 | 9/1987 | Lavi | 395/500 |
| 4,725,975 | 2/1988 | Sasaki | 364/491 |
| 4,727,481 | 2/1988 | Aguille et al. | 364/200 |
| 4,736,288 | 4/1988 | Shintani et al. | 364/200 |
| 4,744,084 | 5/1988 | Beck et al. | 364/578 |
| 4,780,819 | 10/1988 | Kashiwagi | 395/500 |
| 4,807,115 | 2/1989 | Torng | 364/200 |
| 4,899,273 | 2/1990 | Omoda et al. | 395/500 |
| 4,937,770 | 6/1990 | Samuels et al. | 364/578 |
| 4,937,827 | 6/1990 | Beck et al. | 364/578 |
| 4,939,637 | 7/1990 | Pawloski | 364/232.8 |
| 5,027,355 | 6/1991 | Stoica | 364/488 |
| 5,050,195 | 9/1991 | Munter | 375/373 |
| 5,056,013 | 10/1991 | Yamamoto | 395/500 |
| 5,059,818 | 10/1991 | Witt et al. | 327/175 |
| 5,095,454 | 3/1992 | Huang | 364/578 |
| 5,133,062 | 7/1992 | Joshi et al. | 395/500 |
| 5,136,697 | 8/1992 | Johnson | 395/375 |
| 5,226,126 | 7/1993 | McFarland et al. | 395/375 |
| 5,226,130 | 7/1993 | Favor et al. | 395/375 |
| 5,263,149 | 11/1993 | Winlow | 364/578 |
| 5,321,828 | 6/1994 | Phillips et al. | 395/500 |
| 5,325,512 | 6/1994 | Takahashi | 395/500 |
| 5,425,036 | 6/1995 | Liu et al. | 364/578 |
| 5,438,672 | 8/1995 | Dey | 395/500 |

FOREIGN PATENT DOCUMENTS

| | | |
|---|---|---|
| 0 350 141 | 1/1990 | European Pat. Off. . |
| 2 273 835 | 6/1994 | United Kingdom . |

OTHER PUBLICATIONS

Tom R. Halfhill, "AMD K6 Takes On Intel P6", BYTE magazine, Jan. 1996, pp. 67–68, 70 and 72.

PiE Design Systems, Inc., MARS III—Virtual Silicon™ MP Series, Brochure, Nov. 1992.

PiE Design Systems, Inc., PiE Design Systems Announces $1 Million in Sale in Asia, Brochure, Nov. 1992.

PiE Design Systems, Inc., Pie Design Systems Inc. Offers the First Logic Emulation System Below $2 per Gate, Brochure, Nov. 1992.

Brian Case, "AMD Unveils First Superscalar 29K Core", Microprocessor Report, Oct. 24, 1994, pp. 23–26.

Michael Slater, "AMD's K5 Designed to Outrun Pentium", Microprocessor Report, Oct. 24, 1994, pp. 1, 6–11.

*Primary Examiner*—Kevin J. Teska
*Assistant Examiner*—Tyrone V. Walker
*Attorney, Agent, or Firm*—Skjerven, Morrill, MacPherson, Franklin & Friel, L.L.P.; Stephen A. Terrile

[57] ABSTRACT

A hardware simulation system is disclosed which includes a high frequency clock which is gated with a system clock to produce a high frequency enabled clock. The high frequency enabled clock is used to clock an edge triggered latch within the hardware simulation system. Thus, the system advantageously emulates level sensitive latches using edge triggered latches.

10 Claims, 1 Drawing Sheet

SIMULATION BY EMULATING LEVEL SENSITIVE LATCHES WITH EDGE TRIGGER LATCHES

BACKGROUND OF THE INVENTION

The present invention relates to hardware simulation and, more particularly, to hardware simulation which emulates level sensitive latches with edge triggered latches.

One of the methods for demonstrating the workability of a hardware design is a hardware prototype. A prototype may be very similar to the target design, differing only in packaging or style, or may be quite different from the final design. The only requirements for a useful prototype are that it be buildable within a reasonable timeframe and that it accurately represent the final design.

As hardware designs have become more and more complex, the ability to generate a hardware prototype of the entire design has become more and more unrealistic. As a result, software simulation of the hardware design has become more prevalent. Software simulation of a hardware design has the advantage of emulating very complex hardware designs; however, software simulations of these complex hardware designs are slow. As a result, hardware prototyping tools have been developed which provide much of the flexibility of software simulations but are significantly faster to operate than a corresponding software simulation. An examples of such a hardware prototyping tool is available under the trade designation Virtual Silicon from PiE of Sunnyvale, Calif. These hardware prototyping tools are then used to provide hardware simulation systems.

These hardware prototyping tools provide field programmable gate arrays (FPGAs) to allow a reconfigurable device for hardware emulation. Each FPGA device contains reconfigurable hardware resources than can emulate a small amount of arbitrary logic. The PiE box contains a large number of FPGA devices, each FPGA device including simulatable gates and latches (e.g., a typical PiE box can contain more than 1000 simulatable gates and latches). The PiE box also contains a reconfigurable interconnection network between the FPGA devices such that any arbitrary logic design can be mapped into a PiE box and emulated at a relatively high clock speed.

The prototyping system is built from FPGA devices that contain edge triggered latches. When used to emulate a hardware design that also contains edge triggered latches, the FPGA can be re-configured to map each emulated latch into one of the system's physical latches. This makes an efficient use of the hardware resources in the system. However, when the system is used to emulate a design that contains level sensitive latches rather than edge triggered latches, the edge triggered latch resources of the system do not accurately model the level sensitive latches of the design.

An edge triggered device passes information on the falling or rising edge of a clock signal. A level sensitive device, also referred to as a transparent device, passes information while the clock signal is active. Accordingly, an edge triggered device updates its output during the small sampling of time that is centered around the edge of the clock signal; a level sensitive device updates its output during the relatively longer period of time that corresponds to when the clock is active. A hardware design using one or the other of these types of devices takes advantage of the characteristics of the type of device that is used in the design.

One way to use a hardware simulation system which includes edge triggered devices to emulate a hardware design which uses level sensitive devices is to build level sensitive latch elements out of the basic gates available in the simulation system. FIG. 1, labeled prior art, shows an example of such a latch element. Such a solution is both wasteful of the unused edge triggered latch resources of the system and wasteful of the reconfigurable logic elements of the system which could otherwise be used to emulate non-latch components of the design.

SUMMARY OF THE INVENTION

It has been discovered that providing a hardware simulation system with a high frequency clock which is gated with a system clock to produce a high frequency enabled clock, the high frequency enabled clock being used to clock an edge triggered latch, advantageously provides a hardware simulation system with edge triggered latches which emulate level sensitive latches.

DETAILED DESCRIPTION

Figure 1:
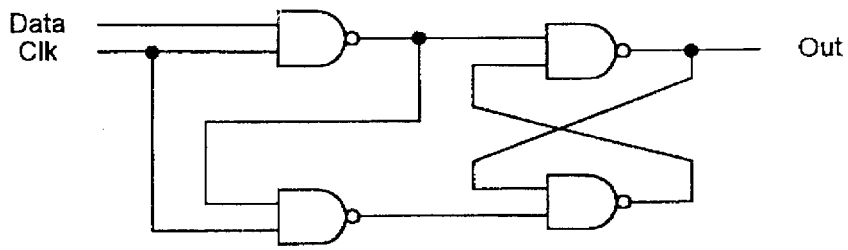
FIG. 1, labeled prior art, shows a level sensitive latch which is assembled using discrete gates.
Figure 2:
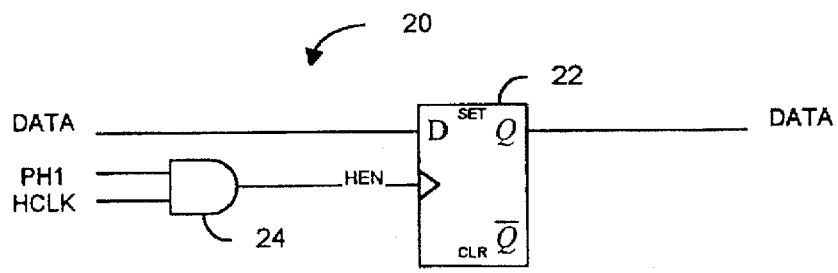
FIG. 2 shows a level sensitive emulation circuit for emulating a level sensitive latch using an edge trigger latch in accordance with the present invention.

Referring to FIG. 2, level sensitive emulation circuit 20 includes edge sensitive latch 22 as well as AND gate 24. AND gate 24 receives a system clock signal (PH1) as well as a high frequency clock signal (HCLK) and provides a high frequency enabled clock signal (HEN) to edge sensitive latch 22. Edge sensitive latch 22 is a D flip flop which passes the signal which is provided to the D input terminal to the Q output terminal when a rising edge is provided to the clock input of the flip flop. A typical hardware simulation system includes a plurality of level sensitive emulation circuits 20.

Figure 3:
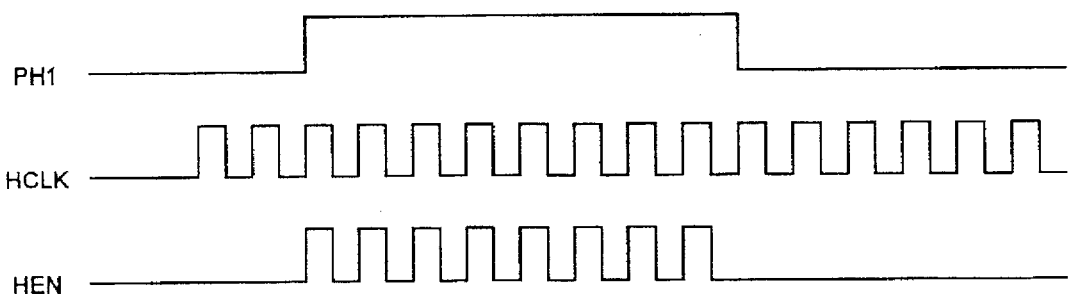
FIG. 3 shows a timing diagram of the operation of the FIG. 2 level sensitive emulation circuit.

Referring to FIG. 3, a timing diagram of the various clock signals which are used by level sensitive emulation circuit 20 is shown. By ANDing the system clock signal with the high frequency clock signal, the high frequency enabled signal is provided when the system clock signal is high. Accordingly, when the system clock signal is high, the high frequency enabled signal includes a plurality of rising edges. These rising edges allow whatever information is provided to the D input of the latch to be passed to the Q output, thus allowing the edge sensitive latch to emulate a level sensitive latch.

The hardware simulation system provides a high frequency clock signal which has a ratio of 10:1 of the frequency of the system clock signal. This ratio is chosen such that the high frequency enabled signal includes enough edges to accommodate the maximum number of transparent latches through which a signal would pass during an active clock signal in a worst case scenario of a hardware design. More specifically, this high frequency clock to system clock ratio is determined by dividing the time that the system clock signal is active by the time necessary to pass through a transparent latch, i.e., the delay time of the device, of the actual hardware design.

If this ratio is too low, then the hardware simulation system may end up causing errors in the simulation which are actually simulation artifacts. For example, if the hardware system can pass through five latches during an active clock period and the ratio of the high frequency clock signal to the system clock signal is 4:1, then the hardware simulation system may generate errors which would not be errors during the operation of the actual hardware design. If the ratio is too high, then the hardware simulation system wastes time that could be used simulating the hardware design.

What is claimed:

1. A method of simulating a hardware design having a plurality of level sensitive latches comprising providing a simulation circuit, the simulation circuit including a plurality of field programmable gate arrays and a plurality of edge triggered latches;

providing a data signal to the simulation circuit;

providing a system clock signal having a system clock signal frequency to the simulation circuit;

generating a high frequency clock signal, the high frequency clock signal frequency having a frequency ratio to the system clock signal frequency which is greater than one;

gating, using a field programmable gate array, the system clock signal with the high frequency signal to provide a high frequency enabled signal;

providing the data signal to a data input of one of the edge sensitive latches; and clocking the one of the edge sensitive latches with the high frequency enabled signal.

2. The method of claim 1 wherein the high frequency clock signal frequency is at least five times the system clock signal frequency.

3. The method of claim 1 wherein the high frequency clock signal frequency is ten times the system clock signal frequency.

4. The method of claim 1 wherein the frequency ratio between the high frequency clock signal and the system clock signal provides a high frequency enabled signal which includes enough edges to accommodate the maximum number of level sensitive latches through which a signal passes during an active system clock signal of the hardware design.

5. The method of claim 1 further comprising determining the frequency ratio by dividing the time that the system clock signal is active in a period by the delay time of the level sensitive latches.

6. An apparatus for simulating a hardware design having a plurality of level sensitive latches, the apparatus comprising:

a field programmable gate array including a plurality of field programmable gates, at least one field programmable gate of the field programmable gate array coupled to receive a system clock signal having a first frequency and a high frequency clock signal having a second frequency greater than the first frequency, the at least one field programmable gate gating the system clock and the high frequency clock to provide a high frequency enabled signal; and a plurality of edge triggered latches, at least one of the edge triggered latches coupled to receive a data signal at a data input and the high frequency enabled signal at a clock input.

7. The apparatus of claim 6 wherein the second frequency is at least five times the first frequency.

8. The apparatus of claim 6 wherein the second frequency is ten times the first frequency.

9. The apparatus of claim 6 wherein the second and the first frequency are in a frequency ratio which provides a high frequency enabled signal which includes enough edges to accommodate the maximum number of level sensitive latches through which a signal passes during an active system clock signal of the hardware design.

10. The apparatus of claim 6 wherein the second and the first frequency are in a frequency ratio determined by dividing the time that the system clock signal is active in a period by the delay time of the level sensitive latches.

* * * * *